(12) United States Patent
Ito

(10) Patent No.: US 6,639,188 B2
(45) Date of Patent: Oct. 28, 2003

(54) CERAMIC HEATER

(75) Inventor: Yasutaka Ito, Gifu (JP)

(73) Assignee: Ibiden Co., Ltd., Ibi-gun (JP)

( * ) Notice: Subject to any disclaimer, the term of this patent is extended or adjusted under 35 U.S.C. 154(b) by 0 days.

(21) Appl. No.: 09/915,418

(22) Filed: Jul. 27, 2001

(65) Prior Publication Data

US 2002/0043527 A1 Apr. 18, 2002

Related U.S. Application Data

(63) Continuation of application No. PCT/JP00/00818, filed on Feb. 15, 2000.

(30) Foreign Application Priority Data

Nov. 30, 1999 (JP) ............................................. 11-341284
Dec. 7, 1999 (JP) ............................................. 11-347065

(51) Int. Cl.$^7$ ................................................ H05B 3/60
(52) U.S. Cl. .............................. 219/444.1; 219/448.11
(58) Field of Search ........................... 219/444.1, 465.1, 219/466.1, 467.1, 543, 544, 546, 552, 448.11; 118/724, 725, 728

(56) References Cited

U.S. PATENT DOCUMENTS

| | | | | |
|---|---|---|---|---|
| 2,007,111 A | * | 7/1935 | Morgan ...................... | 219/544 |
| 2,179,934 A | * | 11/1939 | Jones ........................ | 219/460.1 |
| 4,518,848 A | * | 5/1985 | Weber ...................... | 219/444.1 |
| 5,306,895 A | * | 4/1994 | Ushikoshi et al. .......... | 219/385 |
| 5,688,331 A | * | 11/1997 | Aruga et al. ................ | 118/725 |
| 5,817,406 A | * | 10/1998 | Cheung et al. ............. | 428/210 |
| 6,035,101 A | * | 3/2000 | Sajoto et al. ............... | 118/728 |
| 6,197,121 B1 | * | 3/2001 | Gurary et al. .............. | 118/725 |

FOREIGN PATENT DOCUMENTS

| | | |
|---|---|---|
| JP | 1-102375 | 4/1989 |
| JP | 4-084723 | 3/1992 |
| JP | 5-200641 | 8/1993 |
| JP | 7-263523 A | 10/1995 |
| JP | 07-263523 | 10/1995 |
| JP | 9-235166 | 9/1997 |

OTHER PUBLICATIONS

U.S. patent application Ser. No. 09/462,067.
U.S. patent application Ser. No. 09/471,759.
U.S. patent application Ser. No. 09/524,010.
U.S. patent application Ser. No. 09/673,953.
U.S. patent application Ser. No. 09/765,361.

* cited by examiner

Primary Examiner—Sang Paik
(74) Attorney, Agent, or Firm—Oliff & Berridge, PLC

(57) ABSTRACT

A ceramic heater capable of reducing temperature uniformity at the periphery of through holes such as insertion holes and vacuum suction holes is provided, which protects wafer against thermal shocks and has improved controllability for temperature control parts such as thermocouples and temperature fuse. Further, a ceramic heater capable of uniform resin curing is provided. A heat generation body is disposed on the surface or inside of a ceramic substrate. Further, corners for the insertion holes, the recesses and the vacuum suction holes of the ceramic substrate are chamfered.

9 Claims, 13 Drawing Sheets

(a) Present invention

Picture substitution for figure (b) Prior art

Picture substitute for figure

CERAMIC HEATER

CROSS REFERENCE TO RELATED APPLICATIONS

This application is a continuation of International Application No. PCT/JP00/00818, filed Feb. 15, 2000, and claims the priority of Japanese Patent Application No. 11341284, filed Nov. 30, 1999, and Japanese Patent Application No. 11347065, filed Dec. 7, 1999.

TECHNICAL FIELD

The present invention relates to a ceramic heater, and more particularly, it relates to a ceramic heater for use in manufacture or inspection processes of semiconductors.

BACKGROUND ART

As is well known, semiconductor products are of great importance and semiconductor chips as a typical example thereof are manufactured, for example, by preparing silicon wafers by slicing silicon single crystals to predetermined thickness and then forming various circuits on the silicon wafers.

The various circuits are formed into circuit patterns by sputtering or etching on silicon wafers and, since sputtering or etching is conducted at a high temperature and corrosive gases are sometimes used, they are preferably made of ceramic sintering products.

Such ceramic heaters comprise, as main constituent elements, a ceramic substrate and, a heat generation body disposed substantially over the entire rear face of the substrate, for example, a resistor pattern that generates heat upon current supply.

In existent ceramic heaters having such a constitution, it is preferred that insertion holes for lift pins for receiving and handing wafers (for example as disclosed in Japanese Patent Application Laid-open No. Hei 11-40330) or vacuum suction holes for heating the wafer in a state closely adhered to a heating surface are formed preferably, because the former is advantageous for conducting charge and discharge of wafers to and from the ceramic heater and the latter is advantageous for conducting rapid heating.

Further, since it is necessary for temperature control of the ceramic heater, recesses are disposed on the rear face of the ceramic heater for attaching temperature control parts such as thermocouple or thermal fuse and such temperature control parts are attached to the recesses.

However, the present inventors have found that the temperature becomes ununiform or lower temperature spots in which the temperature lowers locally are formed at the periphery of through holes such as the insertion holes or vacuum suction holes and in the recesses.

Such low temperature spots may possibly cause thermal shocks to the wafer upon heat-drying treatment. Further, the bottom of the recess is a portion in direct contact with the temperature control parts, for example, a temperature measuring element and, if the temperature is not uniform at the portion of the bottom, it is not preferred since the controllability of the temperature control part is lowered.

Further, a resin is sometimes coated on the wafer, which is exposed for development and thermally cured, but there was a problem that the cure of the resin was not uniform.

It is an object of the present invention to provide a ceramic heater capable of reducing the ununiformity of the temperature at the periphery of through holes such as insertion holes or vacuum suction holes thereby protecting the wafer against thermal shocks. Further, it is a subject of the present invention to provide a ceramic heater improved with the controllability for the temperature control parts such as thermocouples or thermal fuses.

A further object of the present invention is to provide a ceramic heater capable of uniformly curing resins.

DISCLOSURE OF INVENTION

The present inventors have made earnest studies for overcoming such problems and, as a result, have reached an idea that chamfering for the corner of the ceramic main body has an effect of improving ununiformity in the temperature distribution.

For dissolving the subject described above, a ceramic heater according to this invention has temperature control means on the surface or inside of a ceramic substrate in which at least a portion of corners of the ceramic substrate is chamfered.

In this case, it is preferred that the ceramic substrate has through holes and the corner of the through hole is chamfered. For example, it is preferred that a corner defined with the wall surface of the through hole and the surface of the ceramic substrate is chamfered.

In this case, the ceramic substrate preferably has a recess for containing a temperature control part on the side opposite to the heating surface, and the corner of the recess is chamfered. For example, it is preferred that the corner defined with the wall surface of the recess and the surface of the ceramic substrate and/or the corner defined with the bottom of the recess and the wall surface of the recess is chamfered.

In this case, it is preferred that the corner at the outer circumference of the ceramic substrate is chamfered at least on the side of the heating surface. For example, it is preferred that at least the corner defined with the outer circumferential lateral side of the ceramic substrate and the heating surface of the ceramic substrate is chamfered and/or the corner defined with the outer circumferential lateral side of the ceramic substrate and the lateral side of the ceramic substrate opposite to the heating surfaces is chamfered.

In this case, it is preferred that a groove is formed in the ceramic substrate and the corner of the groove is chamfered. For example, it is preferred that the corner defined with the upper surface and the groove wall surface of the groove and/or the corner defined with the bottom and the groove wall surface of the groove is chamfered.

The "corner" includes (i) a corner defined with the heating surface or the surface opposite to the heating surface of the ceramic substrate and the outer circumferential lateral side of the ceramic substrate, (ii) a corner defined with a wall surface of a vacuum suction hole and a surface of the ceramic substrate in a case where the ceramic substrate has a such a vacuum suction hole for adsorbing and fixing a heated body placed on the main body, (iii) a corner defined with a wall surface of an insertion hole and surface of a ceramic substrate in a case where the ceramic substrate has such an insertion hole for lift pin for lifting a heated part, (iv) a corner defined with a wall surface of a recess and a surface of a ceramic substrate and/or a corner defined with a bottom surface of the recess and the wall surface of the recess in a case when the ceramic substrate has a recess for containing a temperature control part such as temperature measuring element (thermocouple, thermistor) or thermal fuse, which is appended to the heating means, and (v) a corner defined with an upper surface of a groove and a wall surface and a corner defined with the bottom surface of the groove and the wall surface of the groove in a case where the groove is formed on the surface of the ceramic substrate. In each of the corners, it is necessary at least the corner on the side of the heating surface or the side nearer to the heating surface is chamfered.

Further, while the corner on the side opposite to the heating surface has less thermal effect on the wafer but it is preferred that the corner on the side opposite to the heating surface is also chamfered.

THE BEST MODE FOR CARRYING OUT THE INVENTION

Figure 1:
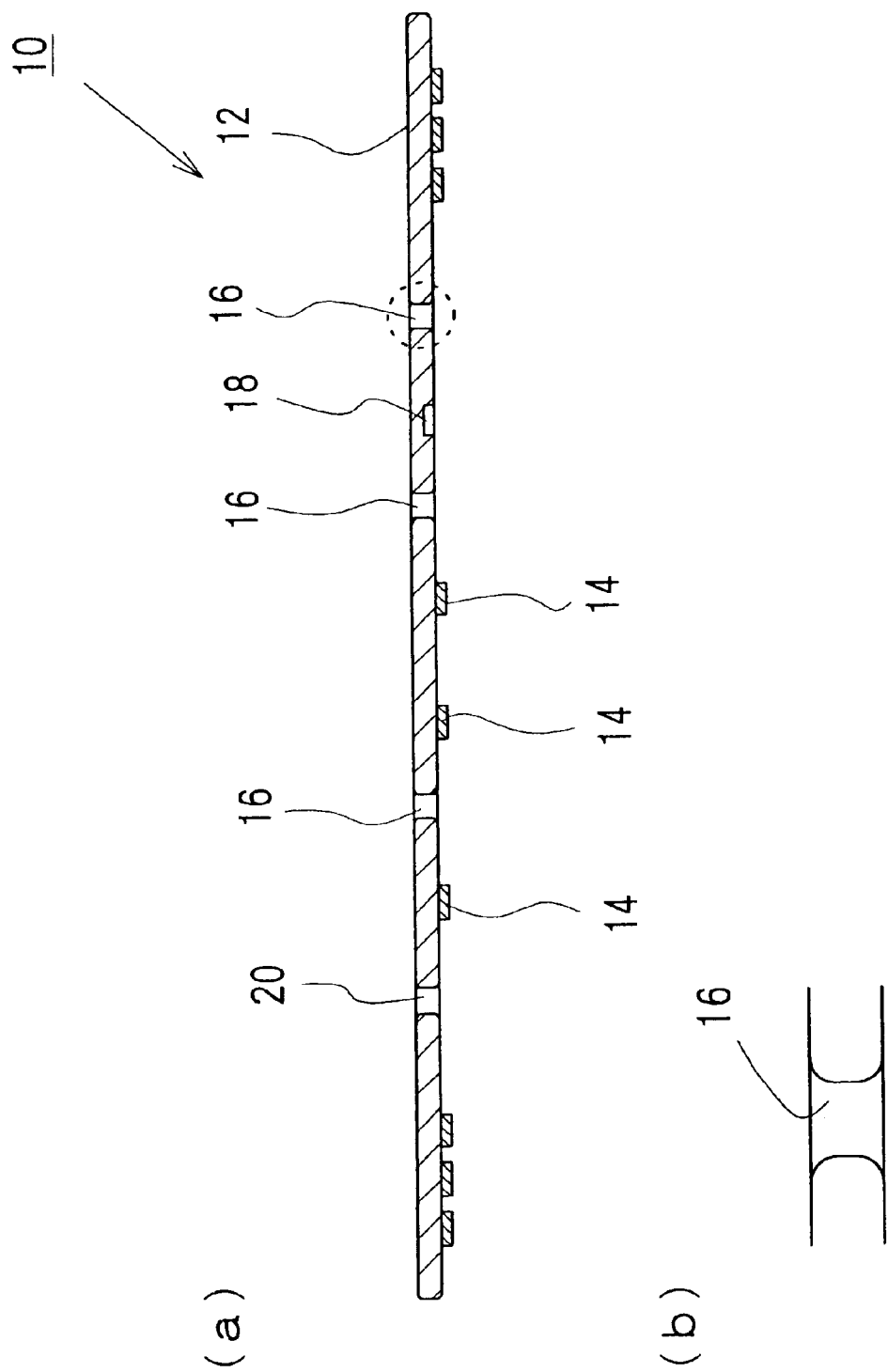
FIG. 1 is cross sectional view showing a schematic constitution of a ceramic heater according to one embodiment of the present invention.

A preferred embodiment of the present invention is to be explained with reference to the drawings.

FIG. 1(a) shows a basic constitution of a ceramic heater 10 according to one embodiment of the present invention and FIG. 1(b) is an enlarged view for a dotted portion in FIG. 1(a). The ceramic heater 10 has a disk-like ceramic substrate 12 and a heat generation body (resistor) pattern 14 formed concentrically or spirally on the surface of the substrate opposite to the heating surface, in which insertion holes 16 for lift pins (not illustrated) are formed passing through a central region of the ceramic substrate 12, for example, at 3 to 20 positions. In the figure, they are shown at two positions for the sake of convenience. Further, a recess 18 for containing thermocouple is formed on the surface of the ceramic substrate 12 opposite to the heating surface so that the recess 18 is positioned apart from the insertion holes 16.

As the sintering ceramic body constituting the ceramic substrate 12, a sintered nitride ceramic body excellent in heat resistance and having high heat conductivity is preferably selected. As the nitride ceramic, sintered material of nitride ceramic materials such as aluminum nitride, silicon nitride, boron nitride and titanium nitride are preferred, sintered aluminum nitride material being particularly preferred. This is because of the highest heat conductivity among the sintered materials. In addition, sintered body of carbide ceramics such as silicon carbide, zirconium carbide, titanium carbide, tantalum carbide and tungsten carbide may be selected.

As the ceramic substrate 12, those of a disk-shape are used preferably. In a square ceramic heater, since heat is conducted concentrically, temperature is lowered on the surface at four corners and uniform temperature cannot be obtained so that uniform temperature is not attained. On the contrary, since the disc-shaped ceramic substrate has a configuration similar to the pattern of the heat conduction, it has excellent uniformity of temperature, so that wafers can be heated. Therefore, in the disk-like ceramic substrate, specific points such as low temperature spots have to be eliminated.

As the ceramic substrate 12, those having a diameter of 150 mm or more are optimal. This is because those having a diameter of 150 mm or less show high heat conduction and can ensure the uniformity of temperature to some extent with no chamfered structure at the corners. The thickness of the ceramic substrate 12 is preferably from 1 to 30 mm. This is because the heat capacity is excessive to lower the temperature increase or decrease rate if the thickness is too large. Particularly, those having a diameter of 200 mm or more are preferred and those having a diameter of 300 mm or more are optimal. This is because the temperature tends to become ununiform as the heating area is larger for which the effect of the present invention is remarkable. Further, the thickness is preferably 50 mm or less, suitably, 20 mm or less and optimally 5 mm or less.

The insertion holes 16, be vacuum suction holes 20 and the recesses 18 may be formed to the ceramic substrate 12 either in the stage of a green molding product before sintering or in the stage of a sintered product after sintering, but it may be conducted preferably in the state after sintering since cracks or defects are less formed. As the fabrication method, drilling, punching or the like can be adopted. Through holes such as the insertion hole 16 and the vacuum suction hole 20 and the recess 18 do not always have to be formed as a set but may be changed variously such as individually or as a combination of selected two types of them.

The heat generating body (resistor) pattern 14 is formed, for example, by baking a conductive paste to the ceramic substrate 12 constituted, for example, with a sintered ceramic body. As the conductive paste, those containing metal particles, metal oxides, resins, solvents and the like are used generally. Suitable metal particles used for the conductive paste can include, for example, gold, silver, platinum, palladium, lead, tungsten and nickel. This is because such metals are less oxidized when exposed to a high temperature and have sufficient resistance value upon heat generation by current supply. Suitable metal oxides used for the conductive paste can include, for example, those metal oxides such as lead oxide, zinc oxide, silica, boron oxide, alumina, yttria and titania.

The heat generation body 14 formed on the surface or in the inside of the nitride ceramic substrate 12 is preferably divided into two or more circuits. This is because the electric power supplied to each of the circuits can be controlled to vary the amount of heat generation by dividing the circuits, by which the temperature on the heating surface of the semiconductor wafer can be adjusted.

The heat generation body pattern can include, for example, concentric circle, spiral shape, eccentric circle or undulated curve but a concentrical pattern as shown in FIG. 1 is preferred since the temperature can be made uniform for the entire ceramic substrate plate.

When the heat generation body 14 is formed on the surface of the ceramic substrate 12, it is preferred to adopt a method of coating a conductive paste containing metal particles on the surface of the ceramic substrate 12 to form a conductive paste layer of a predetermined pattern, baking the same and sintering metal particles on the surface of the ceramic substrate 12. It may suffice for the sintering of metals that metal particles are fused to each other and metal particles and the ceramic are fused to each other.

When the heat generation body 14 is formed on the surface of the ceramic substrate 12, the thickness of the heat generation body 14 is preferably from 1 to 30 $\mu$m and, more preferably, 1 to 10 $\mu$m. Further, when the heat generation body is formed in the inside of the ceramic substrate 12, the thickness is preferably from 1 to 50 $\mu$m.

Further, when the heat generation body 14 is formed on the surface of the ceramic substrate 12, the width of the heat generation body is preferably from 0.1 to 20 mm and, more preferably, 0.1 to 5 mm. Further, when the heat generation body is formed in the inside of the ceramic substrate 12, the width of the heat generation body 14 is, preferably, from 5 to 20 $\mu$m.

The resistance value can be varied in the heat generation body 14 depending on the width and the thickness thereof, and the ranges described above are most practical. As the body is made thinner or finer, the resistance value increases more. The thickness and the width are increased in a case where the heat generation body 14 is formed in the inside of the ceramic substrate 12. However, since the distance between the heating surface and the heat generation body 14 is shortened to degrease the uniformity of the temperature on the surface when the heat generation body 14 is disposed inside, it is necessary to enlarge the width of the heat generation body itself and there is no requirement for considering adhesion with nitride ceramics since the heat generation body 14 is disposed inside, so that high melting metals such as tungsten and molybdenum or carbides of tungsten or molybdenum can be used to increase the resistance value, so that the thickness may be increased with an aim of preventing disconnection. For this purpose, it is preferred that the heat generation body 14 has the thickness and the width as described above.

The heat generation body 14 may have a rectangular or elliptic cross sectional shape but it is preferred to be flat. This is because heat tends to be dissipated easily toward the wafer heating surface in the flat shape, the temperature distribution is less formed in the heating surface.

The aspect ratio (width of heat generation body/thickness of heat generation body) for the cross section is preferably from 10 to 5000. This is because the resistance value of the heat generation body 14 can be increased and the uniformity of the temperature on the heating surface can be ensured by adjusting the ratio within the range.

Assuming the thickness for the heat generation body 14 constant, if the aspect ratio is smaller than the above-mentioned range, the amount of heat conduction in the wafer heating direction of the ceramic substrate 14 is reduced and a heat distribution similar to the pattern of the heat generation body 14 is formed on the heating surface. On the other hand, if the aspect ratio is too large, temperature of a portion just above the central part of the heat generation body 14 is elevated and, after all, a heat distribution similar to the pattern of the heat generation body 14 is formed on the heating surface. Accordingly, considering the temperature distribution, the aspect ratio for the cross section is preferably from 10 to 5000.

When the heat generation body 14 is formed to the surface of the ceramic substrate, the aspect ratio is preferably set to 10 to 200. While when the heat generation body 14 is formed in the inside of the ceramic substrate, the aspect ratio is preferably from 200 to 5000.

The aspect ratio is increased in a case where the heat generation body 14 is formed in the inside of the ceramic substrate. This is because the distance between the heating surface and the heat generation body 14 is shortened to lower the temperature uniformity on the surface when the heat generation body 14 is disposed inside, and it is necessary to make the heat generation body 14 itself to be flat.

When the heat generation body 14 is formed eccentrically in the inside of the ceramic substrate, it is preferably at a position closer to the surface of the ceramic substrate opposite to the heating surface (bottom) and at a position for 50% or more relative to the distance from the heating surface to the bottom. If it is less than 50%, temperature distribution is formed since the heat generation body is excessively closer to the heating surface to form the temperature distribution and, on the other hand, if it exceeds 99%, the ceramic substrate itself to damage the semiconductor wafer.

Further, when the heat generation body 14 is formed in the inside of the ceramic substrate, a plurality of layers for forming the heat generation body may be disposed. In this case, the pattern for each of the layers is such that a heat generation body 14 is formed to certain layer so as to complementary with each other and a pattern is formed in each of the regions as viewed from above the wafer heating surface. Such a structure includes, for example, a pattern offset to each other. Further, the heat generation body 14 may be disposed in the inside of the ceramic substrate and a portion of the heat generation body 14 may be exposed.

There is no particular restriction on the conductor paste, and it preferably contains metal particles or conductive ceramics for ensuring the conductivity and also contains a resin, a solvent or a thickener.

The metal particles are preferably noble metals (gold, silver, platinum and palladium), lead, tungsten, molybdenum and nickel. They may be used alone or two or more of them may be used in combination. The metals are less oxidized and have sufficient resistance value for heat generation.

The conductive ceramics can include, for example, tungsten or molybdenum carbides. They may be used alone or two or more of them may be used in combination. The grain size of the metal particles or the conductive ceramic particles is preferably from 0.1 to 100 $\mu$m. If it is less than 0.1 $\mu$m, they are easily oxidized and, on the other hand, if it exceeds 100 μm, they are less sintered and increase the resistance value.

The shape of the metal particles may be spherical or flaky. When the metal particles are used, they may be a mixture of spherical material and flaky material. It is advantageous when the metal particles is the flaky material or the mixture of the spherical material and the flaky material, because metal oxides can be easily held between the metal particles to ensure the adhesion between the heat generation body 14 and the nitride ceramic, and the resistance value can be increased.

The resin used for the conductor paste can include, for example, epoxy resin and phenol resin. The solvent can include, for example, isopropyl alcohol. The thickener can include, for example, cellulose.

It is preferred that the conductor paste is formed by adding metal oxides to metal particles and the heat generation body 14 is formed by sintering the metal particles and the metal oxides. By sintering the metal oxides together with the metal particles, the nitride ceramic as the heater plate and the metal particles can be joined intimately.

The reason why the adhesion with the nitride ceramic is improved by the mixing of the metal oxides is not apparent but it is supposed that the surface of the metal particles or the surface of the nitride ceramic is slightly oxidized to form oxide films, and the oxide films are sintered integrally with each other by way of the metal oxides to intimately adhere the metal particles and the ceramic.

As the metal oxide, at least one of materials selected from the group consisting of lead oxide, zinc oxide, silica, boron oxide ($B_2O_3$), alumina, yttria, and titania is preferred for instance.

This is because such oxides can increase adhesion between the metal particles and the nitride ceramic without increasing the resistance value of the heat generation body 14.

It is preferred that the ratio for lead oxide, zinc oxide, silica, boron oxide ($B_2O_3$), alumina, yttria, and titania, on the weight ratio, is from 1 to 10 for lead oxide, 1 to 30 for silica, 5 to 50 for boron oxide, 20 to 70 for zinc oxide, 1 to 10 for alumina, 1 to 50 for yttria and 1 to 50 for titania based on 100 parts by weight of the entire amount of the metal oxides, with the sum being adjusted in a range not exceeding 100 parts by weight.

The adhesion with the ceramic nitride can be improved particularly by controlling the amount of the oxides within the range described above.

The addition amount of the metal oxides to the metal particles is preferably from 0.1% by weight or more and less than 10% by weight. Further, the sheet resistivity when the heat generation body 14 is formed by using the conductor paste of such a constitution is from 1 to 45 mΩ/□. If the sheet resistivity exceeds 45 mΩ/□, the amount of heat generation increases excessively and cannot be controlled easily. If the addition amount of the metal oxides is 10% by weight or more, the sheet resistivity exceeds 50 mΩ/□, the amount of heat generation increased excessively making it difficult to control the temperature and lower the uniformity of the temperature distribution.

When the heat generation body 14 is formed on the surface of the ceramic substrate 12, a metal coating layer is preferably formed on the surface of the heat generation body 14. This is formed for preventing oxidation of the sintered metal material in the inside, which changes the resistance value. The thickness of the metal coating layer to be formed is preferably from 0.1 to 10 μm. There is no restriction on the metal to be used upon forming the metal coating layer so long as it is a non-oxidizing metal and, it can include specifically, for example, gold, silver, palladium, platinum and nickel. They may be used individually or two or more of them may be used together. Among them, nickel is preferred.

As the temperature control means applied to the ceramic substrate 12, a method of burying heat generating wires such as tungsten wire, molybdenum wire or nichrome wire in the spiral form may also be used. The heat generating wire has a cross sectional diameter from 10 μm to 300 μm, the cross section of the spiral is circular or elliptic, the elliptic cross section being preferred since it is excellent in the temperature uniformity. In the elliptic shape, it is preferred that the thickness is from 0.1 to 1 mm and the lateral width is from 0.1 to 5 mm.

Figure 2:
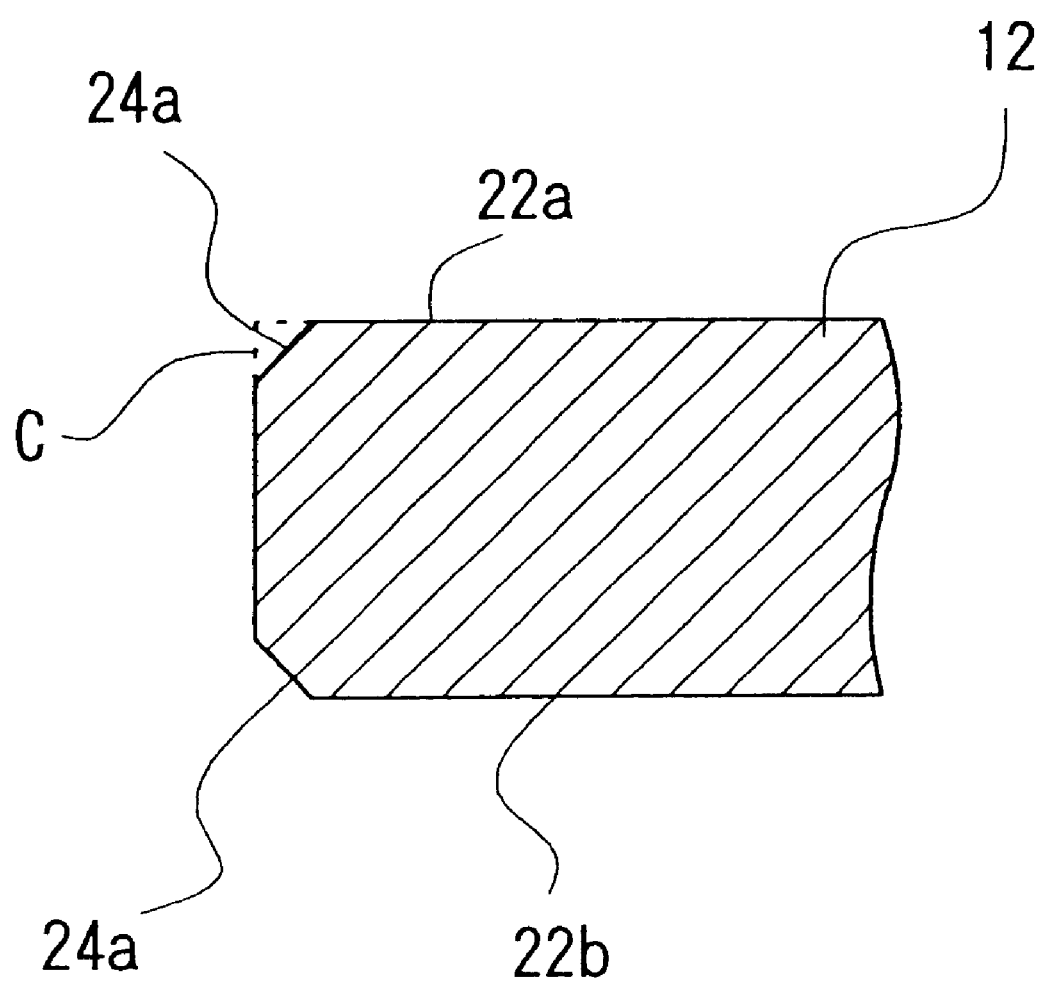
FIG. 2 is an enlarged fragmentary view showing a chamfered structure to a corner at the outer circumference of a ceramic substrate according to one embodiment of the present invention.
Figure 3:
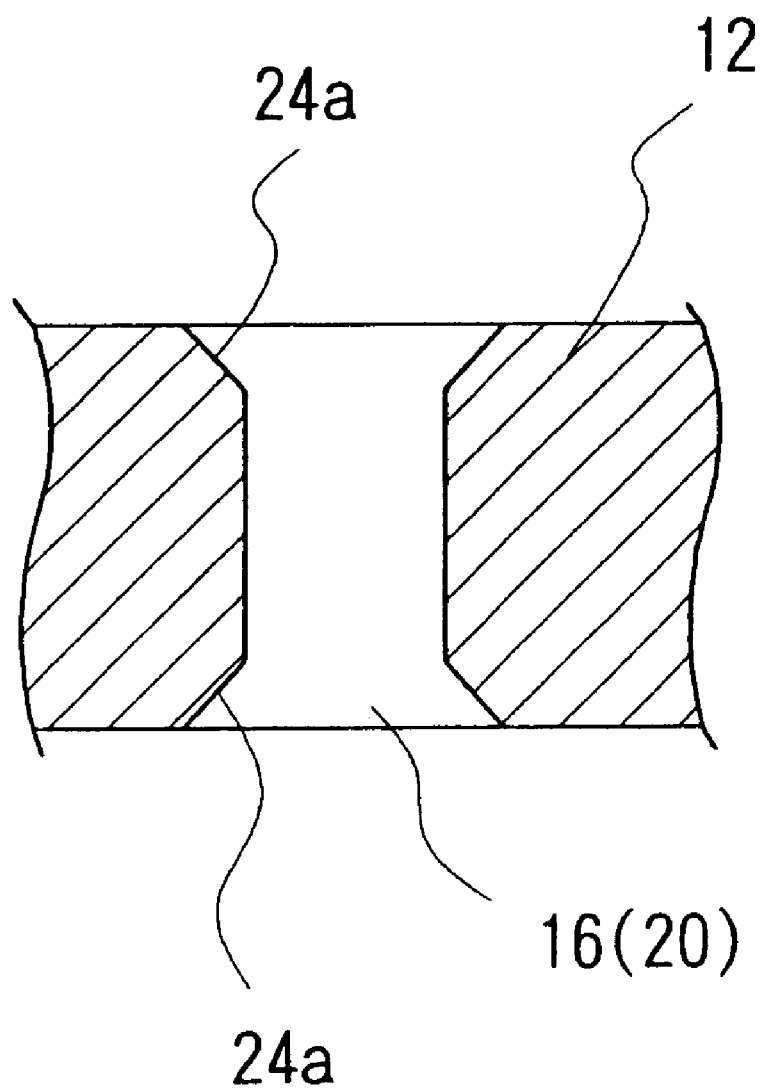
FIG. 3 is an enlarged fragmentary view showing a C-surface chamfered structure to corners at upper and lower ends of a through hole of a ceramic substrate according to one embodiment of the present invention.
Figure 4:
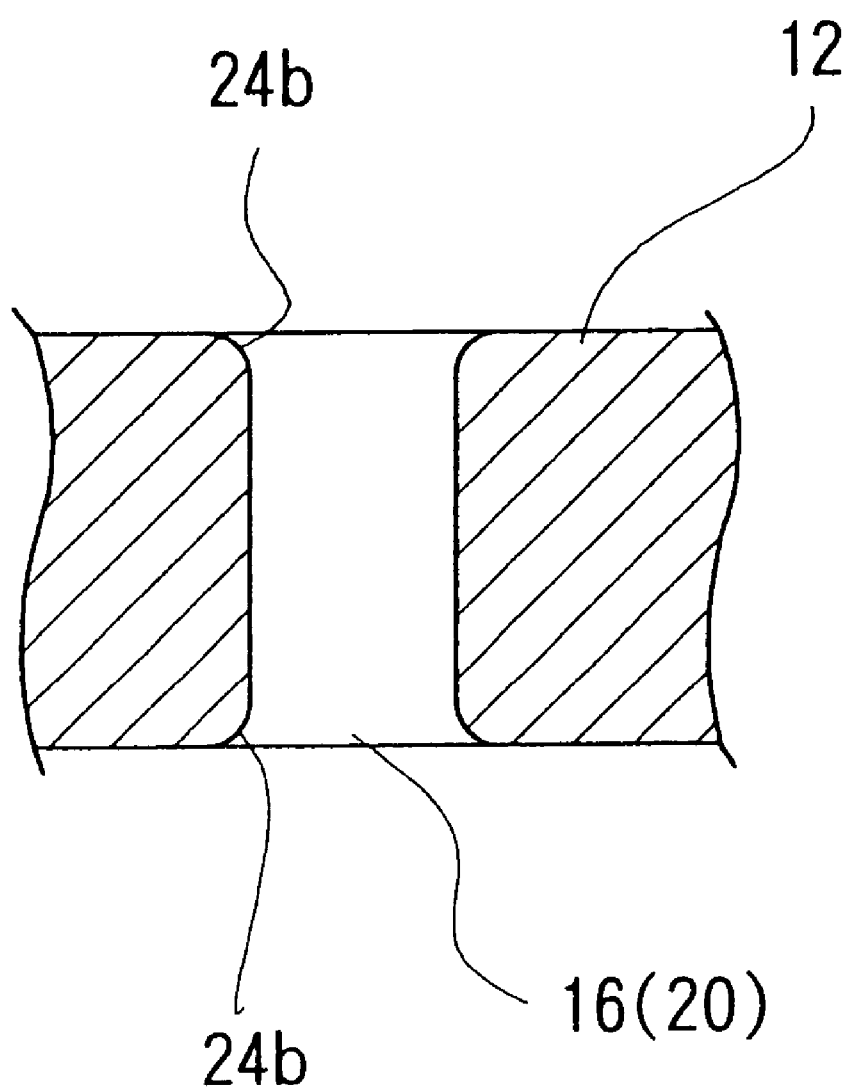
FIG. 4 is an enlarged fragmentary view showing an R-surface chamfered structure to corners at upper and lower ends of a through hole of a ceramic substrate according to one embodiment of the present invention.

Then, the chamfered shape at the corners of the ceramic substrate 12 of the ceramic heater 10 according to one embodiment of the present invention is to be explained more in details with reference to FIG. 2 to FIG. 5. In the drawings, FIG. 2 is an enlarged cross sectional view for the ceramic substrate 12, which shows the state of forming chamfered shapes 24a at the corners of an outer circumference 22a defined with the heating surface and the lateral side of the ceramic substrate 12 and at the corner of an outer circumference 22b defined with the lateral side of opposite to the heating surface and the lateral side of the ceramic substrate. FIG. 3 and FIG. 4 show a state in which chamfered shapes 24a, 24b are formed respectively at corners defined with a hole wall surface of the insertion hole 16 (or vacuum suction hole 20) and the surface of the ceramic substrate. Such chamfered shapes 24a, 24b may also be applied to the recess 18 (refer to FIG. 5). In the recess 18, the corner defined with the wall surface of the recess 18 and the bottom of the recess 18, and a corner defined with the wall surface of the recess 18 and the surface of the ceramic substrate 12 are chamfered.

Figure 6:
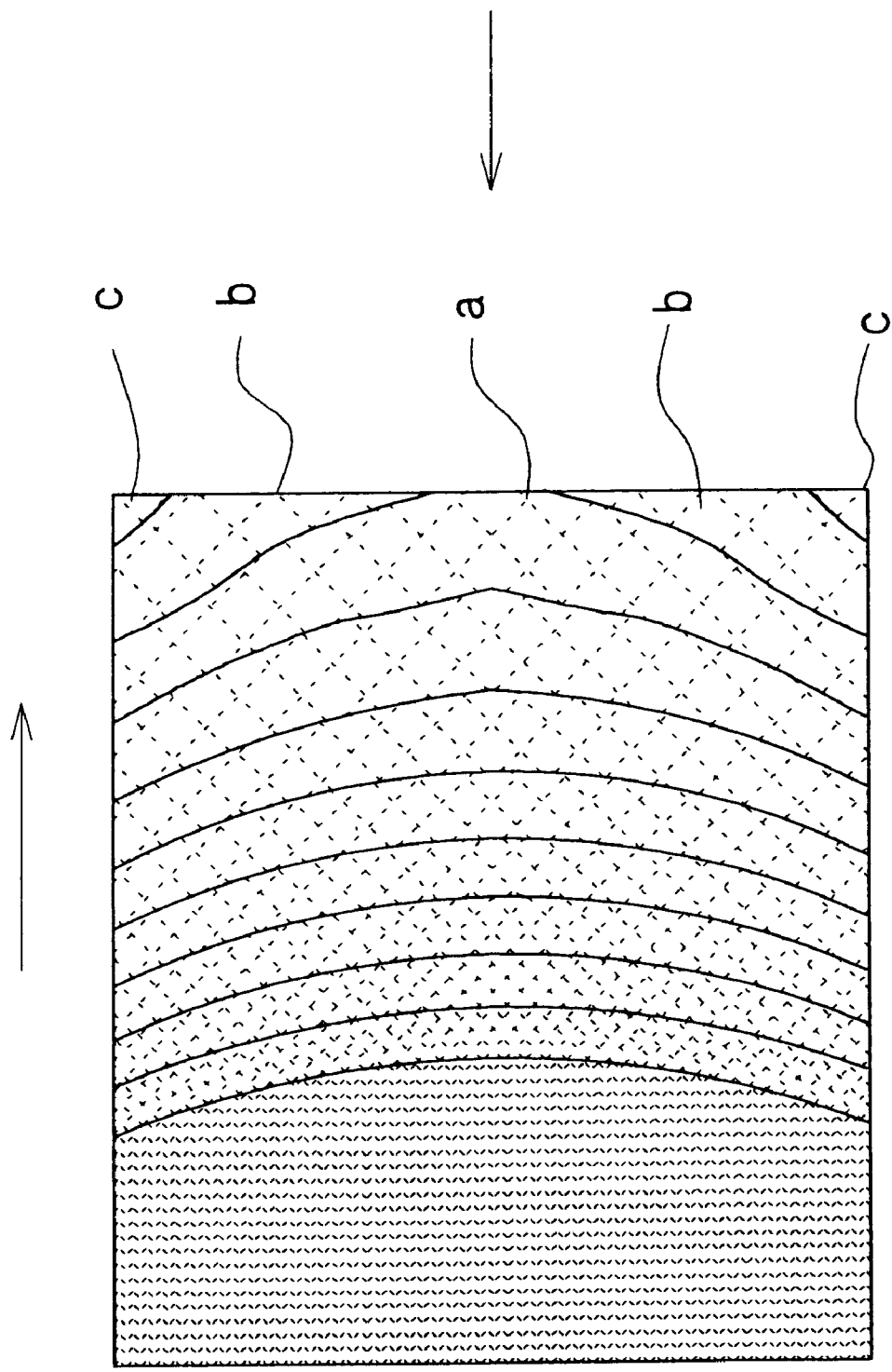
FIG. 6 is a view showing a temperature distribution in a case with no chamfered structure in a ceramic substrate (conventional product).
Figure 7:
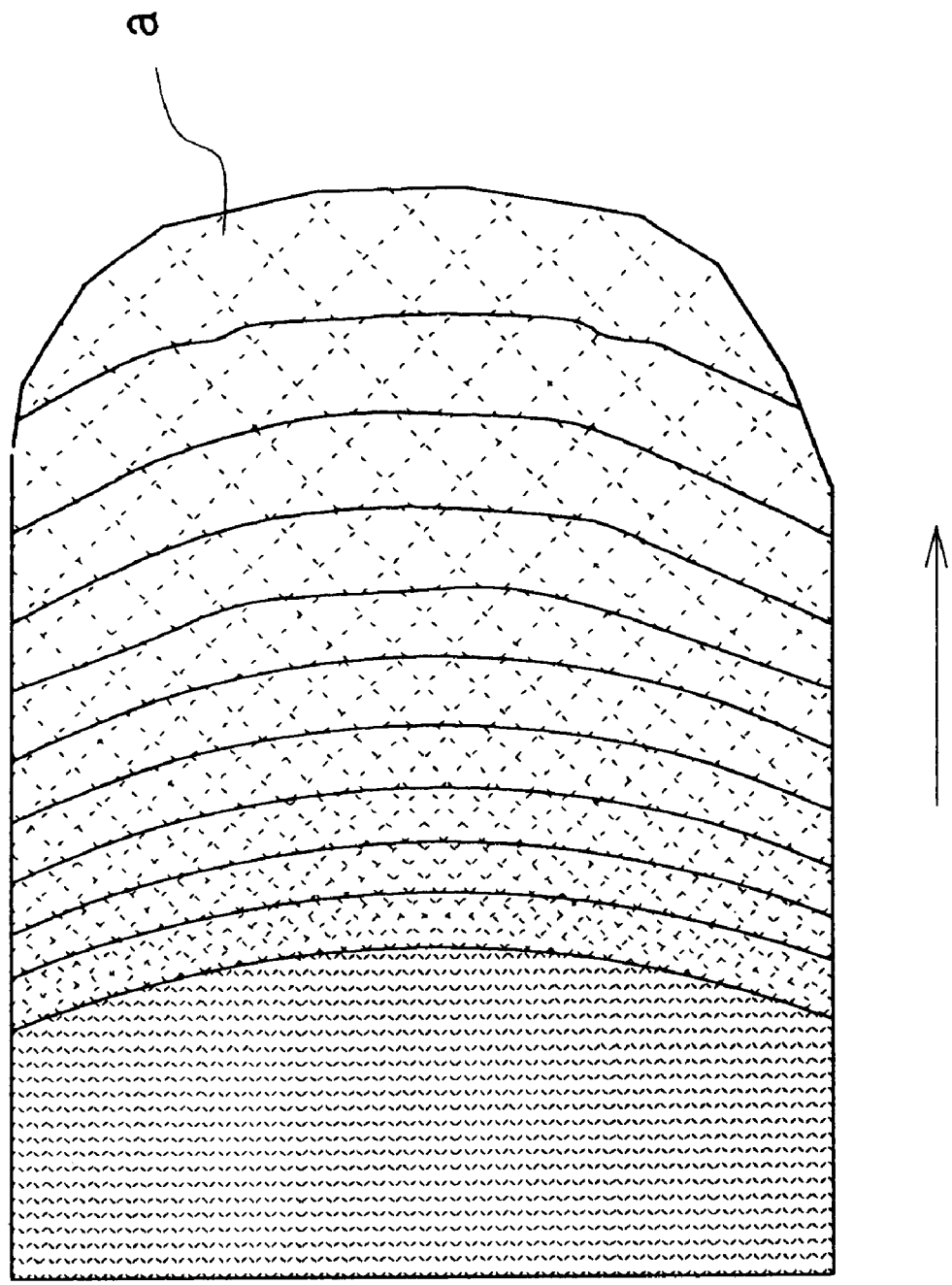
FIG. 7 is a view showing a temperature distribution in a case with a chamfered structure in a ceramic substrate (product of the claimed invention).

FIG. 6 schematically shows the temperature distribution in a case where the corner at the outer circumference or the through hole of the ceramic substrate 12 is not chamfered (existent product) and FIG. 7 schematically shows the temperature distribution in a case where the corner at the outer circumference or the through hole of the ceramic substrate 12 is chamfered (article of the invention). Arrows shown in FIG. 6 and FIG. 7 show the direction of heat conduction. Since heat is dissipated from the surface of the ceramic substrate, the temperature near the surface is lowered and the apparent heat conduction seems somewhat faster in a central portion and somewhat slower near the surface. That is, the temperature is high in the inside and the temperature is lower toward the surface. In FIG. 6 to FIG. 9, the state of the temperature distribution is shown as isotherm formed by sectioning such that each of identical temperature regions is shown in a band-like form. Accordingly, the temperature gradient is more moderate and the temperature uniformity is higher as the band width is wide and the number of temperature sections is small.

As shown in FIG. 6, in a case where no chamfered structure is disposed, since the area of contact between the corner and air is large to increase heat dissipation and, further, the heat capacity increases by so much as the existence of the corner, the heat calorie required for elevating the temperature is also increased by so much, so that the temperature at the corner is lowered, the apparent heat conduction is made slower and a spot of low temperature is formed at the corner. Particularly, in a case of a through hole such as an insertion hole or a vacuum suction hole, the low temperature spot is formed at the periphery of the through hole and when a resin is coated and cured on the wafer, the resin on the spot is not sometimes cured or the wafer may possibly be damaged by thermal shocks. As viewed from the lateral side of the ceramic substrate, (or wall surface of the through hole), it can be seen that the temperature is divided into 5 sections (a: for one position and b, c: for each two positions).

On the contrary, when the corner is chamfered as shown in FIG. 7, since the area of a contact between the corner and air is decreased and the amount of heat generation is lowered, the heat capacity is decreased by so much as the corner is not present and the heat is less dissipated to increase the apparent heat conduction rate and the temperature section as viewed from the lateral side of the ceramic substrate (or the wall surface of the through hole) is reduced to 1 (only for a), so that the temperature can be unified and, in the case of the through hole, a low temperature spot is not formed at the periphery thereof where the temperature is lowered.

Figure 8:
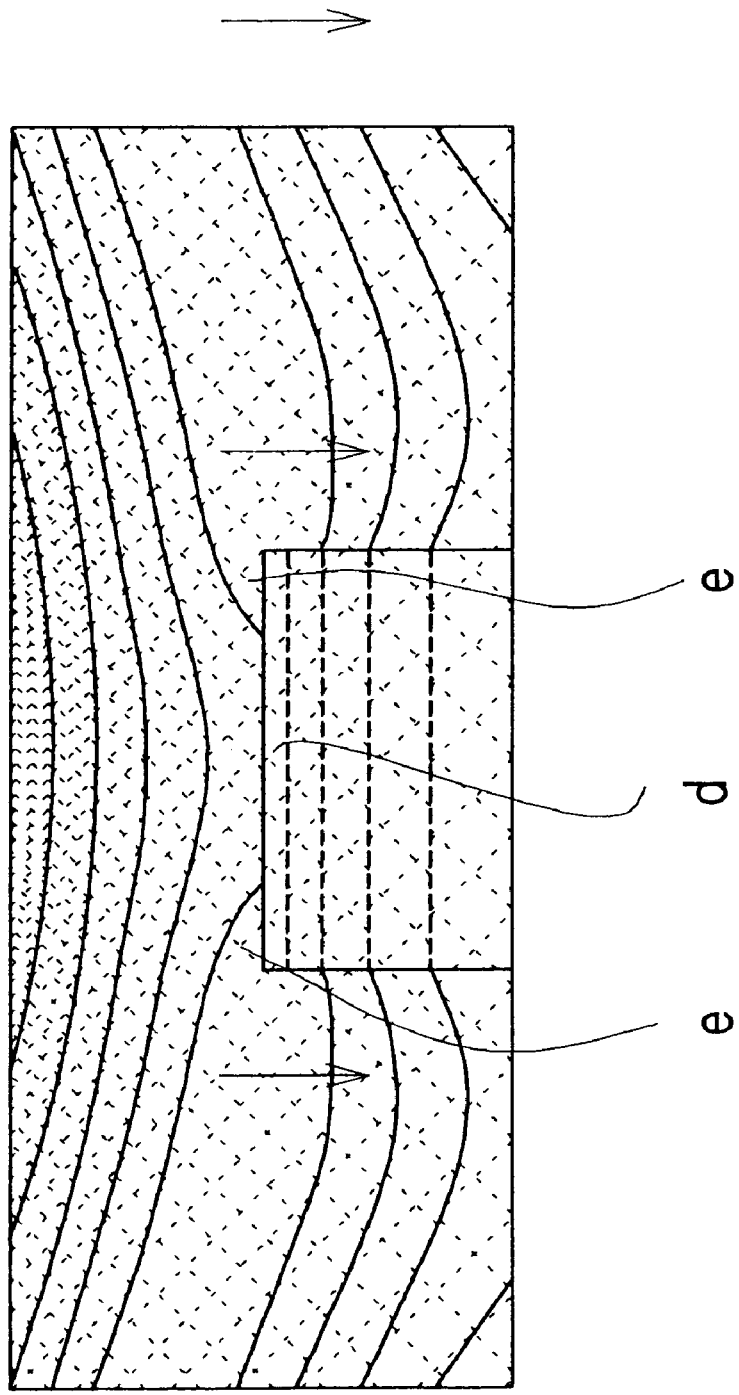
FIG. 8 is a view showing a temperature distribution in a case with no chamfering at the bottom of a recess (conventional product).
Figure 9:
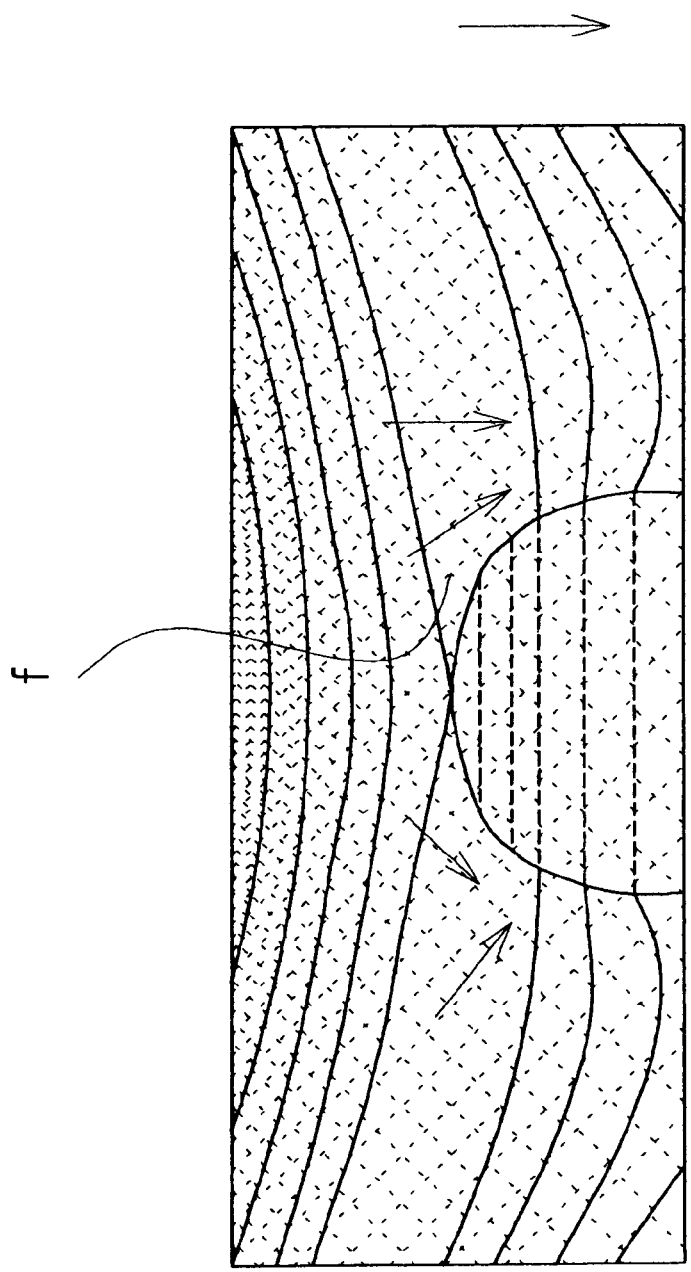
FIG. 9 is a view showing a temperature distribution in a case with chamfering at the bottom of a recess (product of the claimed invention).

Then, FIG. 8 schematically shows a temperature distribution in a case where the corner defined with the wall surface of the recess in the ceramic substrate and the bottom of the recess is not chamfered (conventional product) and FIG. 9 schematically shows the temperature distribution in a case where the corner defined with the wall surface of the recess and the bottom of the recess of the ceramic substrate is chamfered (product of the claimed invention). Arrows shown in FIG. 8 and FIG. 9 show the heat conduction direction. As shown in FIG. 8, in a case where no chamfered structure is formed at the corner, heat conducting from the inside to the recess dissipates from the bottom of the recess into atmospheric air, while most of heat is conducted along the bottom of the recess just laterally toward the corner (lateral direction in the ceramic substrate). This is because the ceramic substrate has higher heat conductivity than air does. Accordingly, since heat from the inside in addition to the heat conducted from the bottom conducts and reaches the corner of the bottom, heat is accumulated and, after all, the temperature at the bottom of the recess becomes ununiform and the temperature on the bottom of the recess forms three sections (d and e for 2 positions).

On the contrary, as shown in FIG. 9, when a chamfered structure is disposed at the corner, heat does not conducts just laterally along the bottom of the recess (in the direction of the lateral side of the ceramic substrate) and the heat is less accumulated and the temperature on the bottom of the recess is made uniform, so that the temperature at the bottom of the recess substantially forms one section (f) as described above. When the corner on the surface of the ceramic substrate is formed into a chamfered structure, since a portion forming the low temperature spot is eliminated, heat is not accumulated and temperature can be prevented from becoming ununiform. Chamfering is often adopted in ceramic structural members for ensuring the strength but the present invention has been accomplished on the novel finding regarding the relationship between the temperature distribution and the chamfered structure, so that the present invention neither lacks in the novelty nor is obvious even if chamfering is adopted in the structural members of ceramics.

In the present invention, the chamfered shape includes a chamfer 24a for making a so-called pointed portion at which surfaces cross to each other into a flat surface (refer to FIG. 2 and FIG. 3), as well as a chamfer 24b for making the pointed portion into a shape of a small rounded portion (refer to FIG. 4 and FIG. 5) and the chamfer 20a is referred to as "C-face 24a" and the chamfer 24b is referred to as "R-face 24b" for avoiding confusion.

In the present invention, the size of the C-face (length for one side of a rectangular triangle containing the C-face 24a as an oblique side as shown by a dotted line in FIG. 2) is within a range preferably from 25 to 2500 µm and, more preferably, from 100 to 500 µm. If the size is too large, heat is dissipated to cause unevenness of temperature, whereas if the size is excessively small, the effect by chamfering cannot be expected and unevenness of the temperature is also caused. On the other hand, radius of curvature r for the R surface is preferably from 15 to 5000 µm and, more preferably, from 200 to 1500 µm. If it is too large, the heat dissipated to cause unevenness of temperature, whereas if the size is excessively small, the effect of chamfering cannot be expected and also unevenness of the temperature is also caused. Further, the size of the C surface, the radius of curvature r, are preferably within a range not exceeding ½ for the thickness of the ceramic substrate at the outer circumference of the main body 10, the insertion hole 16 and the vacuum suction hole 20 and within a range not exceeding ½ of the depth in the recess 18.

Figure 5:
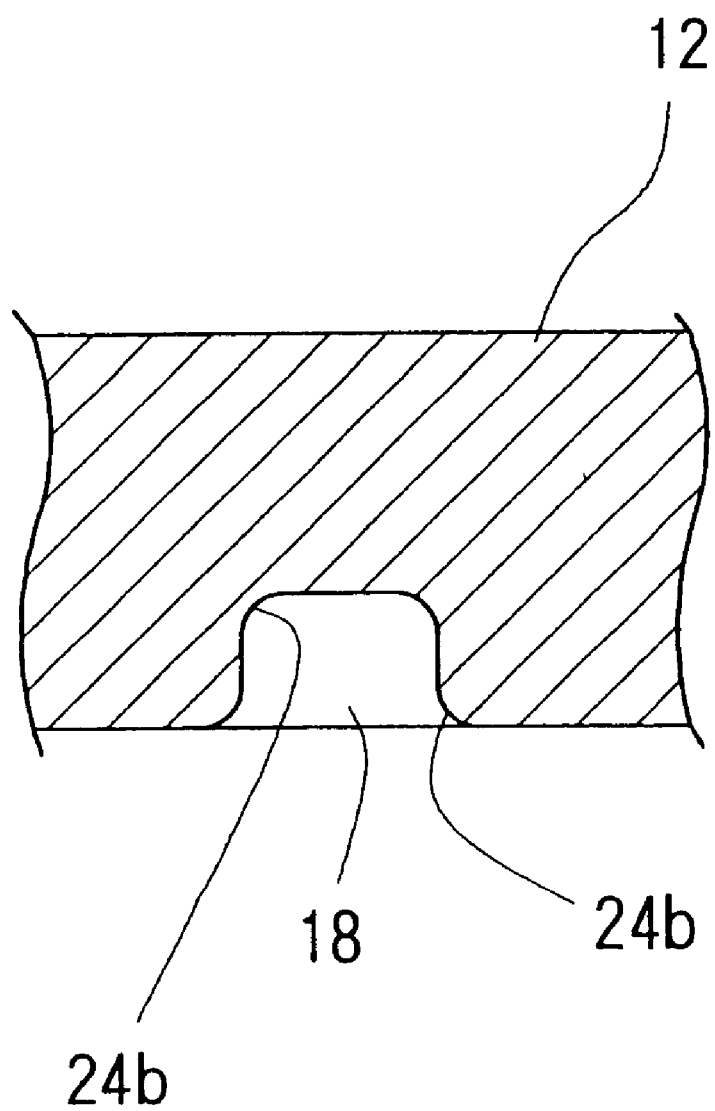
FIG. 5 is an enlarged fragmentary view showing an R-surface chamfered structure to a corner in the recess of a ceramic substrate according to one embodiment of the present invention.

Then, FIG. 4 and FIG. 5 show examples for the insertion hole 16 (or vacuum suction hole 20) and the recess 18 as concrete examples for the R surface. Although not shown in the drawing, the R surface can be formed also to the corner at the outer circumference 22a of the ceramic substrate 12 like that in FIG. 4. The C surface and the R surface may be formed in the stage of a green molding product or in the stage after sintering. However, chamfering for the periphery of the bottom of the recess 18 is preferably applied in the stage of the green molding product since fabrication is difficult after the sintering. For the chamfering applied in the stage after the sintering, various known fabrication means can be applied. For example, surface grinder work or cylindrical grinder work can be applied for the C surface working and NC grinding or lapping can be applied to the R surface working.

Further, the ceramic heater according to one embodiment of the present invention may be formed as an electrostatic chuck by providing electrostatic electrodes thereto or as a wafer prober by providing a chuck top conductor layer to the surface and further providing a guard electrode and a ground electrode at the inside. The ceramic heater according to one embodiment of the present invention can be used within a temperature range from 150 to 800° C. in accordance with the application use.

Figure 10:
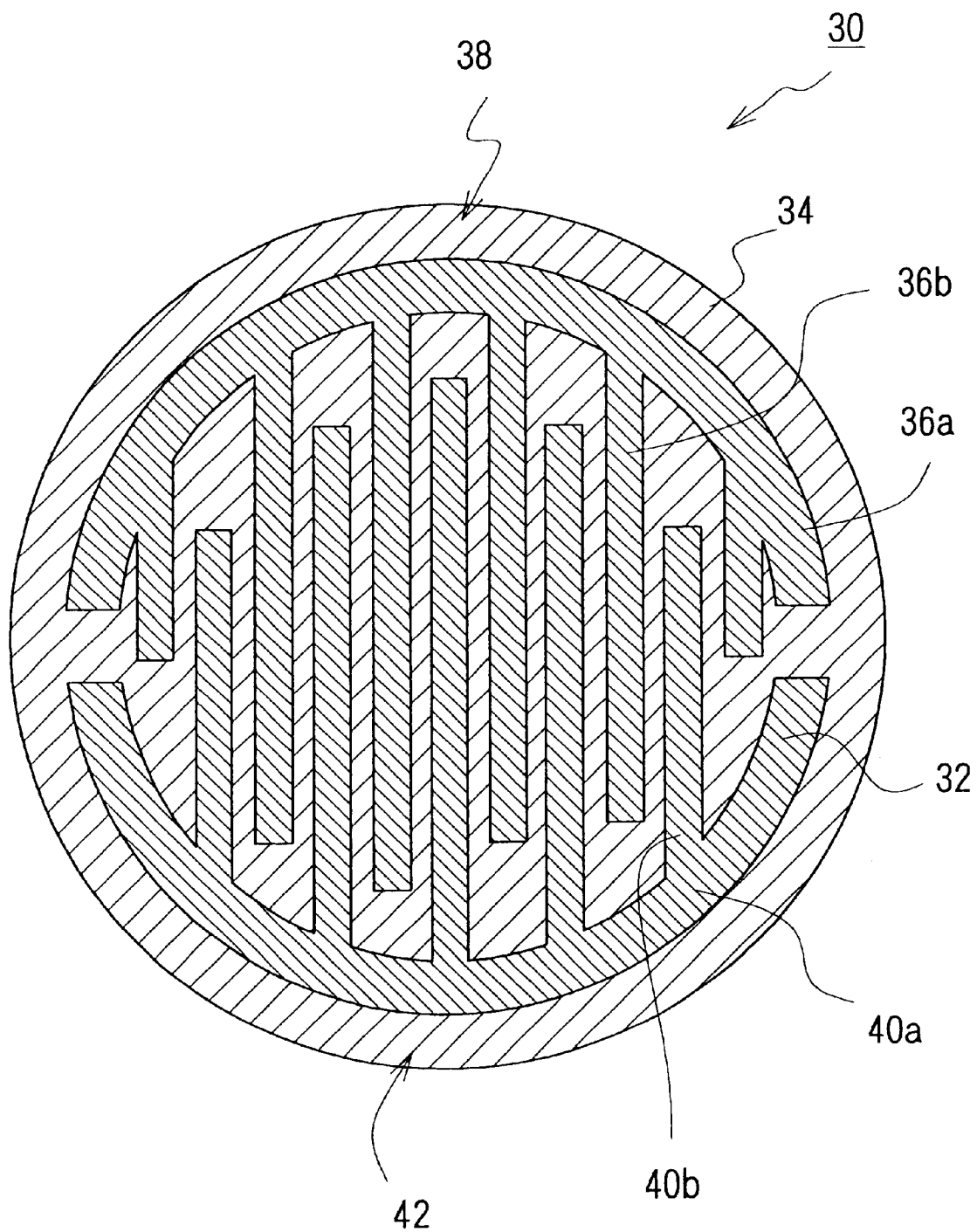
FIG. 10 is a view showing a structure of an electrostatic chuck.

FIG. 10 shows an example for the structure of an electrostatic chuck 30, which is a horizontal cross sectional view schematically showing an example of an electrostatic electrode 32 buried in an electrostatic chuck. The electrostatic chuck 30 is usually formed into a circular shape as viewed in a plane like that the ceramic heater 10, in which a positive chuck electrode electrostatic layer 38 having a semi-circular part 36a and a comb part 36b, and a negative chuck electrode electrostatic layer 42 also having a semi-circular part 40a and a comb part 40b are opposed in the inside of the insulation substrate 34 such that the comb parts 36b and 40b are offset to each other.

When the electrostatic chuck 30 is used, positive side and negative side of a DC power source are connected, respectively, with the positive chuck electrode electrostatic layer 38 and the negative chuck electrode electrostatic layer 42 and a DC voltage is applied. Then, a semiconductor wafer placed on the electrostatic chuck 30 is electrostatically attracted in the electrostatic chuck 30.

A heat generation body may be formed in the inside or on the surface of the insulation substrate 34 like that for the ceramic heater 10.

The method of manufacturing the electrostatic chuck 30 is substantially identical with the method of manufacturing the ceramic heater 10 excepting that a conductive paste is coated on the surface of a green sheet so as to form the shape of the positive chuck electrode electrostatic layer 38 and the negative chuck electrode electrostatic layer 42, or a metal foil is buried in the green molding product so as to form the shape of the positive chuck electrode electrostatic layer 38 and the negative chuck electrode electrostatic layer 42.

Next, a wafer prober according to one embodiment of the present invention will be explained. In a wafer prober 50 (refer to FIG. 12(g)), a chuck top conductor layer 52 is formed on the surface of the ceramic substrate 12, which is used for the conduction test of semiconductor wafers. The conduction test is carried by placing a wafer on the chuck top conductor layer 52 and pressing thereto a probe card having tester pins. A noble metal layer is formed on the chuck top conductor layer 52 and the noble metal layer can prevent diffusion of boron or phosphorus in the chuck top conductor layer or yttria or sodium in the ceramic without hindering the electrical conduction with the rear face of the wafer. As the noble metal, at least one member selected from gold, silver, platinum and palladium is preferred.

In the embodiment according to the present invention, since the ceramic substrate 12 of high rigidity is used, the chuck top does not warp even when the chuck top is urged by tester pins of the probe card, so that the thickness of the chuck top can be reduced compared with the case of using a metal. Further, since the thickness of the chuck top can be reduced compared with the case of using the metal, even ceramic having lower heat conductive than metal, the heat capacity is decreased and the temperature rising and falling characteristic can be improved.

Further, the thickness of the chuck top conductor layer 12 is preferably from 1 to 10 $\mu$m. If it is less than 1 $\mu$m, the resistance value is too high to perform the function as the electrode. On the other hand, if it exceeds 10 $\mu$m, the layer is liable to be peeled by the stress of the conductor. As the chuck top conductor layer 52, at least one of metals selected from high melting metals such as copper, titanium, chromium, nickel, noble metal (gold, silver, platinum and the like), tungsten and molybdenum can be used. The chuck top conductor layer 52 preferably contains nickel. This is because nickel has high hardness and is less deformed against pressing by the tester pins.

In the waver prober 50, a guard electrode 56a and a ground electrode 56b are preferably buried. The guard electrode is an electrode for canceling stray capacitance present in a measuring circuit and is provided with a ground potential of the measuring circuit (that is, the chuck top conductor layer). Further, the ground electrode is disposed for canceling noises from the temperature control means. The surface of the wafer prober 50 forming the chuck top conductor layer is preferably formed with grooves and vacuum suction holes 68. This is because they can suck air from the vacuum suction holes 68 and adsorb the wafer W while placing the wafer. Then, the corner of the groove is preferably formed with a chamfered structure. This is because the formation of low temperature spots generated on the outer circumference of the vacuum suction hole 68 can be suppressed.

The present invention is to be explained more in details referring to Examples.

EXAMPLE 1

Manufacture of a Ceramic Heater Having a Heat Generation Body on the Surface of a Ceramic Substrate (1) A composition comprising 100 parts by weight of an aluminum nitride powder with an average grain size of 0.6 $\mu$m, 4 parts by weight of yttria (average grainze: 0.4 $\mu$m), 12 parts by weight of an acrylic binder and alcohol was spray dried to prepare a granular powder.

(2) Then, the granular powder was placed in a molding die, and molded into a flat plate to obtain a green molding product (green). Drilling was applied to the green molding product by using drills having a diameter of 10 mm and 0.1 mm to form portions as through holes (25 mm diameter) at 18 positions for inserting support pins (lifter pins) of a semiconductor wafer and portions as recesses for burying thermocouples (diameter: 1.1 mm, depth: 2 mm) at 5 positions (A, B, C, F and G in FIG. 13).

(3) The green molding product after the drilling was hot pressed at 1800° C., under a pressure of 200 kg/cm$^2$ (19.6 MPa) to obtain an aluminum nitride plate of 3 mm thickness.

Then, a disk of 200 mm diameter was cut out of the plate to prepare a ceramic plate (ceramic substrate).

(4) A conductor paste was printed by screen printing on the heater plate obtained in above-mentioned (3). The printing pattern was a concentrical pattern.

As the conductor paste, SILVEST PS603D manufactured by TOKURIKI CHEMICAL RESEARCH CO., LTD. used for forming through holes in printed wiring boards was used. The conductor paste was a silver-lead paste and contained 7.5 parts by weight of metal oxides comprising lead oxide (5 wt %), zinc oxide (55 wt %), silica (10 wt %), boron oxide (25 wt %) and alumina (5 wt %) based on 100 parts by weight of silver. The silver grains were flaky having an average grain size of 4.5 $\mu$m.

(5) Then, the heater plate printed with the conductor paste was heated and sintered at 780° C. to sinter silver and lead in the conductor paste and bake them to the heater plate to form a heat generation body. The silver-lead heat generation body had 5 $\mu$m thickness, 2.4 mm width and 7.7 m$\Omega$/□ sheet resistivity.

(6) The heater plate 11 manufactured in above mentioned (5) was immersed in an electroless nickel plating bath comprising an aqueous solution containing 80 g/l of nickel sulfate, 24 g/l of sodium phosphite, 12 g/l of sodium acetate, 8 g/l of boric acid and 6 g/l of ammonium chloride to deposit a metal coating layer of 1 $\mu$m thickness (nickel layer) on the surface of the silver-lead heat generation body 14.

(7) Silver-lead solder paste (manufactured by Tanaka Kikinzoku) was printed by screen printing to portions for attaching terminals for attaining connection with a power source to form a solder layer. Then, external terminals manufactured by Kovar was placed on the solder layer, put to reflow under heating at 420° C. and external terminals were attached to the surface of the heat generation body.

(8) Thermocouples for temperature control were connected by using a gold flux of 81.7 Au-18.3 Ni (fused by heating at 1030° C.) to obtain a ceramic heater.

Portions for through holes for insertion of support pins (lifter pins) of a semiconductor wafer were chamfered as a C surface and the size was designed as 15 $\mu$m, 200 $\mu$m, 300 $\mu$m, 500 $\mu$m and 800 $\mu$m, while the size of the R surface for the bottom of the recesses was designed as 10 $\mu$m, 200 $\mu$m, 500 $\mu$m, 1000 $\mu$m and 1200 $\mu$m.

COMPARATIVE EXAMPLE 1

A ceramic heater was manufactured as Comparative Example 1 in the same manner as in Example 1 except for not forming the chamfered structure.

(Evaluation Method)

The heaters of Example 1 and the heater of Comparative Example 1 were heated to 400° C., respectively, and the temperature for the wafer heating surface (the surface opposite to the surface for forming the heat generation body) and the temperature for the recess disposed to the heat generation body forming surface were measured by using a thermo-viewer (IR-162010-0012, manufactured by Nippon Datum Co., Ltd.), and the temperature difference between the outer circumference of the through hole and at a position apart by 3 cm from the through hole was examined for the through hole, while the temperature difference for the bottom was examined for the recess. Table 1 shows the result of such measurement.

TABLE 1

|  | Through hole $\mu m$ C surface | Recess $\mu m$ R surface | Temperature difference for through hole (° C.) | Temperature difference for recess (° C.) |
|---|---|---|---|---|
| Example 1-1 | 15 | 10 | 4 | 4 |
| Example 1-2 | 200 | 200 | 1 | 1 |
| Example 1-3 | 300 | 500 | 1 | 1 |
| Example 1-4 | 500 | 1000 | 2 | 2 |
| Example 1-5 | 800 | 1200 | 4 | 4 |
| Comparative Example 1 | 0 | 0 | 8 | 7 |

Figure 13:
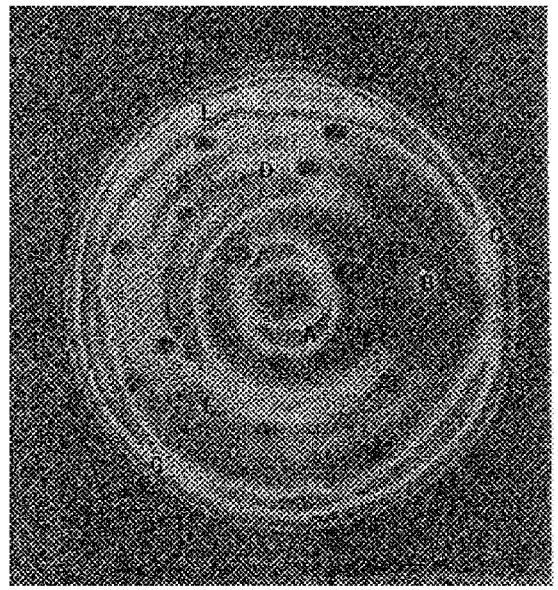
FIG. 13 is a view showing the surface state of an wafer heating surface by a thermo-viewer.
Figure 13:
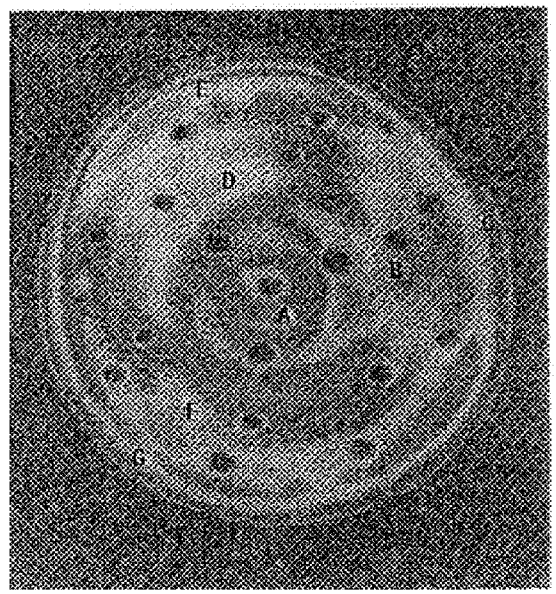

FIG. 13($a$) shows an image of the thermo-viewer in a case of providing the chamfered structure to the through hole (Example 1) and FIG. 13($b$) shows an image for the thermo-viewer in a case of not providing the chamfered structure to the through hole (Comparative Example 1), respectively. While no low temperature spot could be confirmed at the periphery of the through hole in FIG. 13($a$), a low temperature spot was observed in a ring-like shape at the periphery of the through hole in FIG. 13($b$).

EXAMPLE 2

Manufacture of a Ceramic Heater Having a Heat Generation Body and an Electrostatic Electrode for Electrostatic Chuck (1) Paste comprising, in admixture, 100 parts by weight of aluminum nitride (average grain size: 1.1 $\mu m$), 4 parts by weight yttria (average grain size: 0.4 $\mu m$), 11.5 parts by weight of an acrylic binder, 0.5 parts by weight of a dispersant and 53% by weight of an alcohol comprising 1-butanol and ethanol was used and molded by a doctor blade method to obtain a green sheet of 0.47 mm thickness.

(2) Then, after drying the green sheet at 80° C. for five hours, portions as through holes 15 for insertion of semiconductor wafer support pins of 1.8 mm, 3.0 mm and 5.0 mm in diameter and portions as through holes 18 for connection with external terminals were formed by punching.

(3) 100 parts by weight of tungsten carbide particles of 1 $\mu m$ average grain size, 3.0 parts by weight of an acrylic binder, 3.5 parts by weight of α-terpiol solvent and 0.3 parts by weight of a dispersant were mixed to prepare a conductor paste A. 100 parts by weight of tungsten particles having if 3 $\mu m$ average grain size, 1.9 parts by weight an acrylic binder, 3.7 parts by weight of α-terpione solvent and 0.2 parts by weight of a dispersant were mixed to prepare a conductor paste B. The conductor paste A was printed on a green sheet by screen printing to form a conductor paste layer. A conductor paste layer comprising an electrostatic electrode pattern of a shape shown in FIG. 10 was formed on another green sheet. Further, the conductor paste B was filled in the through hole for connection with the external terminals. Further, green sheets not printed with tungsten paste were laminated by 37 sheets on the upper side (heating surface) and by 13 sheets on the lower side at 130° C. under a pressure of 80 kg/cm² (7.84 MPa).

(4) Then, the thus obtained laminate was decreased in nitrogen gas at 600° C. for five hours, hot-pressed at 189° C. under a pressure of 150 kg/cm² (14.7 MPa) for three hours to obtain an aluminum nitride plate of 3 mm thickness. A disk of 230 mm was cut-out from the plate to prepare a ceramic plate having a heat generation body of 6 $\mu m$ thickness and 10 mm width and an electrostatic electrode in the inside.

(5) Then, after grinding the plate obtained in above mentioned (4) by a diamond grind stone, the outer circumference was put to buff grinding to form a C surface (300 $\mu m$) and, further, an R surface: r=300 $\mu m$ and a C surface: 300 $\mu m$ were formed by drilling also to the recesses for the thermocouples and the through holes for the lifter.

(6) Further, a portion of the through hole for use as through hole was scraped to form a recess, and an external terminal made of Kovar was connected to the recess by using a gold flux comprising Ni—Au and put to reflow under heating at 700° C. The connection with the external terminal is preferably has a structure supported at three points by a tungsten support, because this can ensure the connection reliability.

(8) Then, a plurality of thermocouples for temperature control were buried in the recesses to complete manufacture for the ceramic heater having the electrostatic chuck.

COMPARATIVE EXAMPLE 2

The procedures were identical with those in Example 2 except for not providing chamfered structure for any of the outer circumference, recesses and the through holes, to prepare Comparative Example 2.

(Evaluation Method)

A silicon wafer was placed on an electrostatic chuck of Example 2 and an electrostatic chuck of Comparative Example 2, and 1000 volt was applied to obtain an attraction force of 1 kg/cm² (9.8×10⁴ Pa).

The temperature of the electrostatic chucks was elevated to 400° C. and the chucks were left for 2 hours. Further, the test was conducted for 100 cycles to examine the breakage of the wafer. Silicon wafers attracted by using the electrostatic chuck of Example 2 were not broken but the silicon wafers attracted by using the electrostatic chuck of Comparative Example 2 were broken for as much as 10% of them.

EXAMPLE 3

Manufacture of a Wafer Prober Having a Heater Function

Figure 11:
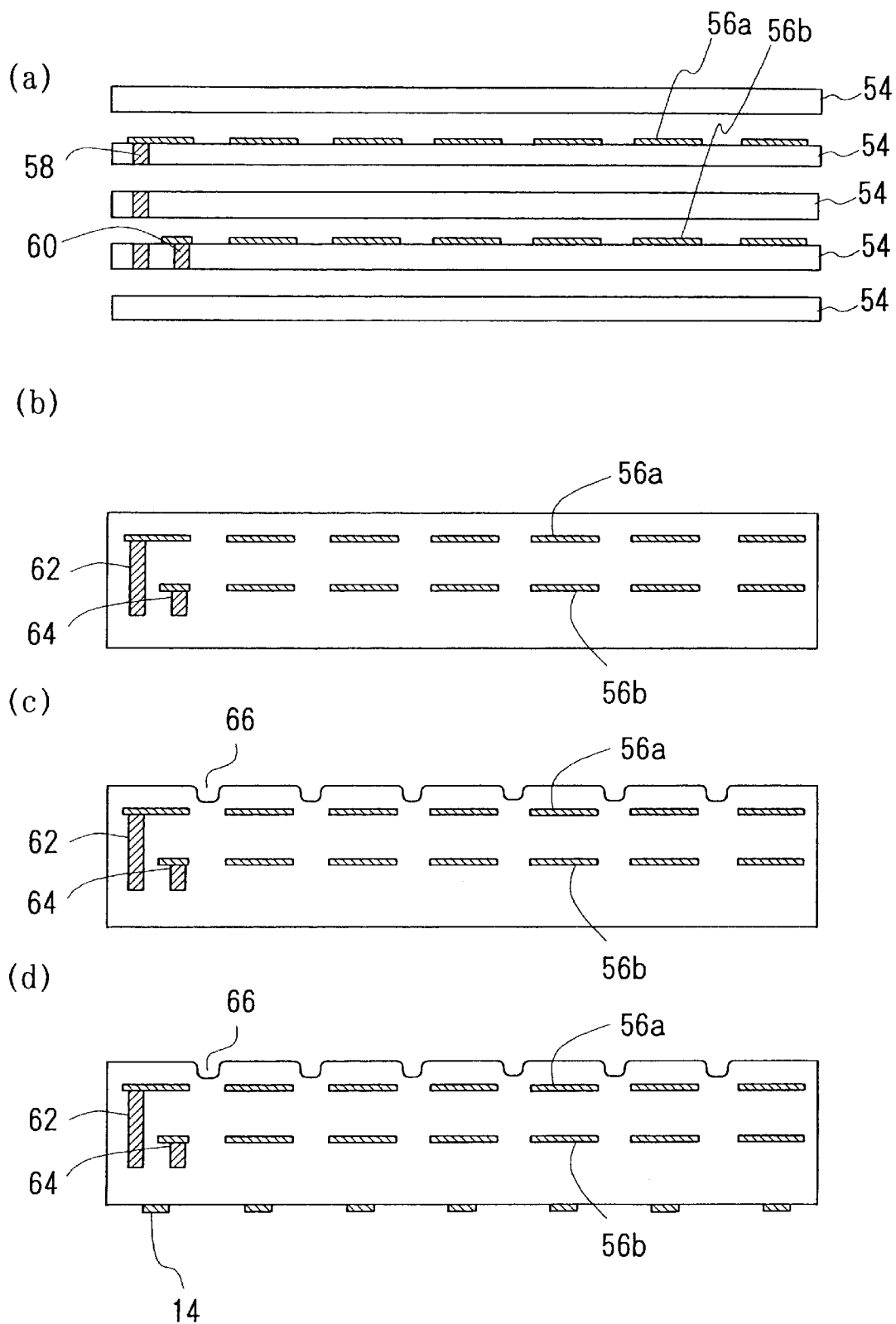
FIG. 11 is a view showing manufacturing steps for a wafer prober according to one embodiment of the present invention.
Figure 12:
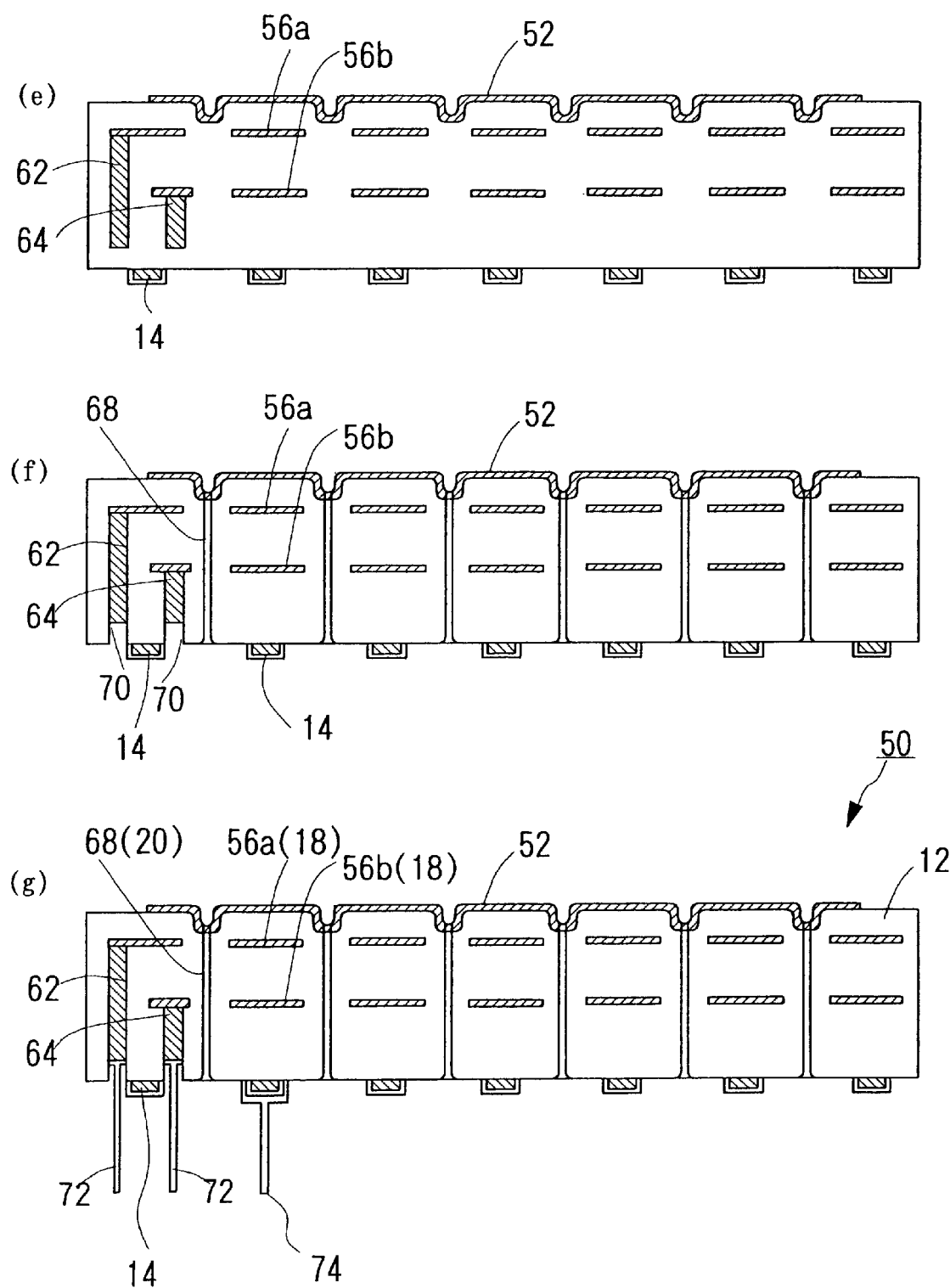
FIG. 12 is a view succeeding to FIG. 11, showing manufacturing steps for a wafer prober according to one embodiment of the present invention.

A waver prober having the heater function was manufactured and it is explained with reference to FIG. 11 and FIG. 12.

(1) A composition comprising, in admixture, 100 parts by weight of aluminum nitride powder (average grain size: 1.1

μm), 4 parts by weight yttria (average grain size; 0.4 μm), 11.5 parts by weight of an acrylic binder, 0.5 parts by weight of a dispersant and 53% by weight of an alcohol comprising 1-butanol and ethanol described above was formed by a doctor blade to obtain a green sheet 54 of 0.47 mm thickness (refer to FIG. 11(a)).

(2) After drying the green sheet 54 at 80° C. for five hours, holes for through holes for connecting the heat generation body and the external terminal pins were formed by punching (refer to FIG. 11(a)).

(3) 100 parts by weight of tungsten carbide particles of 1 μm average grain size, 3.0 parts by weight of an acrylic binder, 3.5 parts by weight of an α-terpione solvent and 0.3 parts by weight of a dispersant were mixed to prepare a conductor paste A. 100 parts by weight of tungsten particles of 3 μm average grain size, 1.9 parts by weight an acrylic binder, 3.7 parts by weight of α-terpione solvent and 0.2 parts by weight of a dispersant were mixed to prepare a conductor paste B.

The conductive paste A was printed on the green sheet 54 by screen printing for the electrode printing body and the ground electrode printing body in a lattice-like shape and printed by using electrode patterns 56a, 56b. Further, conductive pastes B 58, 60 were filled in the holes for through holes for connection with the terminal pins (refer to FIG. 11(a)).

Further, the printed green sheets and not printed green sheets were laminated by 50 sheets and integrated at 130° C. under a pressure of 80 kg/cm² (7.84 MPa).

(4) The laminate was degreased in a nitrogen gas at 600° C. for five hours, and hot pressed at 1890° C. under a pressure of 150 kg/cm² (14.7 MPa) for three hours to obtain a nitride aluminum plate of 3 mm thickness. Then, this was cut out into a disk of 230 mm to prepare a ceramic plate. The size of the through holes 62, 64 was 0.2 mm diameter and 0.2 mm depth. Further, the thickness for the guard electrode 56a and the ground electrode 56b was 10 μm, the position for forming the guard electrode 56b is 1 mm from the heat generation body and the position for forming the ground electrode 56b was 1.2 mm from the groove forming surface (refer to FIG. 11(b)).

(5) After grinding the plate obtained in (4) by a diamond grinding stone, recesses of 2 mm diameter and 2 mm thickness for thermocouples (not illustrated) were formed by using a drill of 0.2 mm diameter. Further, a groove 66 (0.5 mm width, 0.5 mm depth) for wafer adsorption was formed. The groove 66 was also chamfered at r=200 μm by buff grinding (refer to FIG. 11(c)).

(6) Further, a heat generation body 14 was printed to the rear face formed with the groove 66. Conductive paste was used for printing. For the conductive paste, SILVEST PS603D manufactured by TOKURIKI CHEMICAL RESEARCH CO., LTD. used for forming through holes in printed wiring boards was used. The conductive paste is a silver/lead paste and contains 7.5% by weight of metal oxide comprising lead oxide, zinc oxide, silica, boron oxide and alumina (at a weight ratio of 5/55/10/25/5) based on the amount of silver. The silver is of a shape having an average grain size of 4.5 μm and of a flaky shape (refer to FIG. 11(d)).

(7) A heater plate printed with the conductive paste was heated and sintered at 780° C. to sinter silver and lead in the conductive paste and baked to the ceramic substrate 12. Further, the ceramic plate was immersed in an electroless nickel plating bath comprising an aqueous solution at a concentration of 30 g/l of nickel sulfate, 30 g/l of boric acid, 30 g/l of ammonium chloride and 60 g/l of Rochelle salt to deposit a nickel layer 410 having a boron content of 1% by weight or less to a thickness of 1 m on the surface of the silver sintered product. Further, it was annealed at 120° C. for 3 hours.

The pattern by the silver sintering product had 5 μm thickness and 2.4 mm width and sheet resistivity of 7.7 mΩ/□ (refer to FIG. 11(d)).

(8) Titanium, molybdenum and nickel layers were formed on the surface formed with the grooves 66 by sputtering. As the apparatus for sputtering, SV-4540 manufactured by Ulvac Japan Ltd. was used. The conditions were at an atmospheric pressure of 0.6 Pa, a temperature of 100° C. and a power of 200 W and 30 seconds to 1 minute of duration, which were controlled depending on the metals.

The film thus obtained had a thickness of 0.3 μm of titanium, 2 μm of molybdenum and 1 μm of nickel in view of the image of a fluorescence X-ray spectrometer (refer to FIG. 12(e)).

(9) The ceramic plate obtained in above mentioned (8) was immersed in an electroless nickel plating bath comprising an aqueous solution at a concentration of 30 g/l of nickel sulfate, 30 g/l of boric acid, 30 g/l of ammonium chloride and 60 g/l of Rochelle salt to deposit a nickel layer 200 of 7 μm thickness and having a boron content of 1% by weight or less on the surface of the groove 66 (chuck top conductor layer) and then annealed at 120° C. for 3 hours.

Further, it was immersed in an electroless plating solution comprising 2 g/l of potassium cyanoaurate, 75 g/l of ammonium chloride, 50 g/l of sodium citrate and 10 g/l of sodium phosphite under the condition of 93° C. for one minute to form a gold plating layer of 1 mm thickness on the nickel plating layer (refer to FIG. 12(e)).

(10) An air suction hole 68 penetrating from the groove 66 to the rear face was drilled having 1 mm diameter and the periphery of the air suction hole 68 was cut by using a drill of 1.5 mm diameter to form a C surface (400 μm) (refer to FIG. 12(f)).

Further, a blind hole 70 for exposing the through hole was formed. An external pin 72 made of Kovar was connected to the blind hole 70 by using a gold flux comprising an Ni-Au alloy (Au 81.5, Ni 18.4, impurity 0.1) by applying reflow under heating at 970° C. (refer to FIG. 12(g)). Further, an external pin 74 made of Kovar was formed to the heat generation body by way of solder (tin 9/lead 1) (refer to FIG. 12(g)).

(11) A plurality of thermocouples for temperature control were buried in the recesses to obtain a wafer prober heater (wafer prober having a heater function).

COMPARATIVE EXAMPLE 3

The procedures were the same those in Example 3 except for not forming the chamfered structure to prepare Comparative Example 3.
(Evaluation Method)

A temperature elevation test up to 150° C. was conducted for the wafer prober heater of Example 3 and the wafer prober heater of Comparative Example 3. For the temperature control, a temperature controller of E5ZE manufactured by Omron and available in the market was used. The temperature controller can calculate the charged power from the result of measurement. When the surface temperature difference on the surface of the chuck top conductor layer was measured by using the thermo-viewer described previously, the surface temperature difference on the surface of the chuck top conductor layer of Example 3 was about 2° C., whereas the difference was 8° C. in the Comparative Example. This is considered to be attributable to that the thermocouples' failure to accurately measure the temperature.

Since the ceramic heater according to the present invention has the temperature control means on the surf ace or in the inside of the ceramic substrate, and the corner for at least a portion of the ceramic substrate is chamfered, temperature uniformity at the periphery of the through holes such as insertion holes and vacuum suction holes of the ceramic substrate can be reduced, so that the silicon wafer can be protected against thermal shocks. Further, since the ceramic heater according to the present invention is excellent also in the temperature controllability, it is optimal to be incorporated into electrostatic chucks or wafer probers. Furthermore, the ceramic heater according to the present invention can improve the controllability of temperature control parts or can provide uniform resin curing.

What is claimed is:

1. A ceramic heater having temperature control means on a surface or inside of a ceramic substrate, wherein said ceramic substrate has a recess for containing a temperature measuring element formed on a side opposite to a heating surface, a corner defined by a bottom face and a wall face of the recess is chamfered into a first shape having an R surface, and the R surface has a radius of curvature of 15 to 1000 μm.

2. A ceramic heater according to claim 1, wherein said temperature measuring element is a thermocouple.

3. A ceramic heater according to claim 1, wherein said temperature measuring element is a thermistor.

4. A ceramic heater according to claim 1, wherein said ceramic substrate is formed by a nitride ceramic or a carbide ceramic.

5. A ceramic heater according to claim 1, wherein a corner defined by the wall face of the recess and the side of the ceramic substrate is chamfered into a second shape.

6. A ceramic heater according to claim 5, wherein the second shape has a C surface or an R surface.

7. A ceramic heater according to claim 6, wherein the second shape having the C surface has a radius of curvature within a range of 25 to 2500 μm.

8. A ceramic heater according to claim 6, wherein the second shape having the R surface has a radius of curvature within a range of 15 to 1000 μm.

9. A ceramic heater according to claim 1, wherein said temperature control means is a heat generating body.

* * * * *

UNITED STATES PATENT AND TRADEMARK OFFICE
CERTIFICATE OF CORRECTION

PATENT NO. : 6,639,188 B1  Page 1 of 1
DATED : October 28, 2003
INVENTOR(S) : Yasutaka Ito It is certified that error appears in the above-identified patent and that said Letters Patent is hereby corrected as shown below:

<u>Title page,</u>
Item [56], References Cited, FOREIGN PATENT DOCUMENTS, please add:

```
            -- JP 11-040330      02/1999
               JP 11-121600      04/1999
               JP 08-008198      01/1996
               JP Sho58-125388   08/1983
               JP 09-275133      10/1997
               JP 04-125917      04/1992 --
```

Signed and Sealed this

Third Day of February, 2004

JON W. DUDAS
*Acting Director of the United States Patent and Trademark Office*